(12) United States Patent
Huang et al.

(10) Patent No.: US 11,733,605 B2
(45) Date of Patent: Aug. 22, 2023

(54) EUV IN-SITU LINEARITY CALIBRATION FOR TDI IMAGE SENSORS USING TEST PHOTOMASKS

(71) Applicant: KLA Corporation, Milpitas, CA (US)

(72) Inventors: Haifeng Huang, Livermore, CA (US); Damon Kvamme, Los Gatos, CA (US); Rui-Fang Shi, Cupertino, CA (US)

(73) Assignee: KLA Corporation, Milpitas, CA (US)

( * ) Notice: Subject to any disclaimer, the term of this patent is extended or adjusted under 35 U.S.C. 154(b) by 334 days.

(21) Appl. No.: 16/900,539

(22) Filed: Jun. 12, 2020

(65) Prior Publication Data

US 2020/0401037 A1    Dec. 24, 2020

Related U.S. Application Data

(60) Provisional application No. 62/864,313, filed on Jun. 20, 2019.

(51) Int. Cl.
*G03F 1/44* (2012.01)
*G01N 21/956* (2006.01)
(Continued)

(52) U.S. Cl.
CPC ............. *G03F 1/44* (2013.01); *G01N 21/33* (2013.01); *G01N 21/93* (2013.01); *G01N 21/956* (2013.01);
(Continued)

(58) Field of Classification Search
None
See application file for complete search history.

(56) References Cited

U.S. PATENT DOCUMENTS 7,110,901 B2 *  9/2006  Wada .................... G01N 21/59
                                                         369/100
7,126,699 B1 * 10/2006  Wihl .................. G01N 21/9501
                                                         356/625
(Continued)

FOREIGN PATENT DOCUMENTS

CN          102947759 A   *  2/2013  ............. B82Y 10/00
KR       20160108538 A   *  9/2016
(Continued)

OTHER PUBLICATIONS

Nakajima, Y. et al., "Effective-exposure-dose monitoring technique in EUV lithography," Proc. SPIE 7748, Photomask and Next-Generation Lithography Mask Technology XVII, 774824 (May 27, 2010) (Year: 2010).*

(Continued)

*Primary Examiner* — Tarifur R Chowdhury
*Assistant Examiner* — Roberto Fabian, Jr.
(74) *Attorney, Agent, or Firm* — Huse IP Law; Charles C. Huse

(57) ABSTRACT

To calibrate a TDI photomask inspection tool, a photomask with a plurality of distinctly patterned regions is loaded into the tool. The plurality of distinctly patterned regions is successively illuminated with an EUV beam of light. While illuminating respective distinctly patterned regions, respective instances of imaging of the respective distinctly patterned regions are performed using a TDI sensor in the inspection tool. While performing the respective instances of imaging, a reference intensity detector is used to measure reference intensities of EUV light collected from the photomask. Based on the results of the respective instances of imaging and the measured reference intensities of EUV light, linearity of the TDI sensor is determined.

11 Claims, 10 Drawing Sheets

(51) Int. Cl.
  *G03F 1/58* (2012.01)
  *G01N 21/33* (2006.01)
  *G03F 1/24* (2012.01)
  *G01N 21/93* (2006.01)

(52) U.S. Cl.
  CPC .................. *G03F 1/24* (2013.01); *G03F 1/58* (2013.01); *G01N 2021/95676* (2013.01)

(56) References Cited

U.S. PATENT DOCUMENTS

| | | | |
|---|---|---|---|
| 10,319,088 B2 * | 6/2019 | Miyai | G01N 21/8806 |
| 10,648,926 B2 | 5/2020 | Han et al. | |
| 2003/0228529 A1 * | 12/2003 | Dieu | G03F 1/72 |
| | | | 204/192.28 |
| 2007/0222974 A1 | 9/2007 | Zhao et al. | |
| 2009/0284591 A1 * | 11/2009 | Tsuchiya | G01N 21/95607 |
| | | | 382/141 |
| 2011/0181868 A1 | 7/2011 | Stokowski | |
| 2013/0244142 A1 | 9/2013 | Yamane et al. | |
| 2014/0272676 A1 * | 9/2014 | Satake | G03F 1/72 |
| | | | 430/5 |
| 2016/0097727 A1 | 4/2016 | Vazhaeparambil et al. | |

FOREIGN PATENT DOCUMENTS

| | | | | |
|---|---|---|---|---|
| KR | 20190051031 A | | 5/2019 | |
| TW | 201708942 A | * | 3/2017 | ........... G01N 21/956 |

OTHER PUBLICATIONS

Stearns, D. G. et al., "Multilayer mirror technology for soft-x-ray projection lithography," Appl. Opt. 32, 6952-6960 (1993) (Year: 1993).*

PCT/US2020/038015, International Search Report, dated Oct. 6, 2020.

PCT/US2020/038015, Written Opinion of the International Searching Authority, dated Oct. 6, 2020.

* cited by examiner

EUV IN-SITU LINEARITY CALIBRATION FOR TDI IMAGE SENSORS USING TEST PHOTOMASKS

RELATED APPLICATION

This application claims priority to U.S. Provisional Patent Application No. 62/864,313, filed on Jun. 20, 2019, which is incorporated by reference in its entirety for all purposes.

TECHNICAL FIELD

This disclosure relates to image sensors, and more specifically to calibrating time-delay-integration (TDI) image sensors in the extreme ultraviolet (EUV).

BACKGROUND

Optical inspection tools for inspecting photomasks (i.e., reticles) use TDI image sensors (or TDI sensors, for short). To record photomask inspection images with near-zero intensity distortion, the linearity (or equivalently, the nonlinearity) of TDI sensors should be calibrated accurately down to the pixel level. For calibrating the linearity of TDI sensors of optical inspection tools that use 193 nm light, different intensity levels of the 193 nm light are generated and images are recorded for the different intensity levels. The light-intensity control that allows different intensity levels to be generated for this calibration process is realized using a polarizer: the 193 nm light polarization state is controlled without changing the beam profile. A small unpatterned mask area is imaged using full TDI. A calibrated reference intensity detector is placed downstream of the intensity control. Comparing the TDI signal of each pixel from the TDI sensor with the reference signal from the reference intensity detector calibrates the linearity of the TDI sensor. This calibration process is based on transmissive optics.

TDI-sensor linearity calibration is also required for extreme ultraviolet (EUV) photomask inspection tools (e.g., tools that use light at a wavelength of 13.5 nm or at other EUV wavelengths). However, because all known materials absorb EUV light strongly (although still to varying degrees), it is not feasible to perform EUV TDI-sensor linearity calibration with similar transmissive method as for 193 nm inspection tools. One possible method is to use neutral-density (ND) filters of different attenuation levels to control the intensity of incident EUV light. Even if materials (e.g., polysilicon) for such ND filters can be found, however, the thickness of those ND filters would be extremely thin, on the order of tens of nanometers. This thinness makes it impractical to use ND filters for TDI-sensor linearity calibration.

TDI-sensor linearity calibration has traditionally been performed on a bench setup using a visible-wavelength light source. A homogenizing sphere generates a roughly uniform illumination on the TDI sensor. By changing the light intensity and using a well-calibrated reference detector, the TDI-sensor linearity (i.e., the TDI response nonlinearity) can be calibrated. This traditional approach, however, has several disadvantages. First, this approach does not account for wavelength-dependence of sensor nonlinearity. Second, it is difficult to change the overall light intensity without perturbing the illumination profile on the TDI sensor. Third, EUV TDI-sensor linearity calibration should be performed in situ (i.e., inside the inspection tool, with the TDI sensor installed in the inspection tool). In-situ calibration is desirable because of convenience: the complexity of EUV inspection systems makes it impractical to remove the TDI sensor for bench calibration. In-situ calibration is also desirable to reduce the cost of calibration: bench calibration requires expensive resources such as an extra EUV light source, vacuum conditions, and room space. Finally, a TDI sensor may accumulate a few dead pixels (i.e., pixels that become defective and stop working) over its lifetime. These dead pixels result in a need to calibrate the scan-averaged non-linearity of the TDI sensor in situ periodically. Bench calibration cannot determine this scan-averaged nonlinearity.

SUMMARY

Accordingly, there is a need for effective and convenient methods and systems for performing in-situ EUV TDI-sensor linearity calibration. This need may be met with test photomasks that allow different intensities of EUV light to be generated in situ.

In some embodiments, a test structure for calibrating an image sensor includes a photomask with a plurality of distinctly patterned regions to provide different respective intensities of extreme ultraviolet (EUV) light in response to illumination with an EUV beam.

In some embodiments, a calibration method includes loading a photomask with a plurality of distinctly patterned regions into a time-delay-integration (TDI) inspection tool. The plurality of distinctly patterned regions is successively illuminated with an EUV beam of light. While illuminating respective distinctly patterned regions of the plurality of distinctly patterned regions, respective instances of imaging of the respective distinctly patterned regions are performed using a TDI sensor in the TDI inspection tool. While performing the respective instances of imaging, a reference intensity detector is used to measure reference intensities of EUV light collected from the photomask. Based on the results of the respective instances of imaging and the reference intensities of EUV light measured by the reference intensity detector, linearity of the TDI sensor is determined.

In some embodiments, a system includes a TDI inspection tool with an EUV light source and a TDI sensor. The system also includes a photomask to be loaded into the TDI inspection tool. The photomask has a plurality of distinctly patterned regions to provide different respective intensities of EUV light in response to illumination with an EUV beam generated by the EUV light source. The system further includes a reference intensity detector to be mounted in the TDI inspection tool to measure intensities of EUV light collected from the photomask.

BRIEF DESCRIPTION OF THE DRAWINGS

For a better understanding of the various described implementations, reference should be made to the Detailed Description below, in conjunction with the following drawings. The drawings may not be to scale.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Extreme ultraviolet (EUV) photomask (i.e., reticle) inspection tools are typically completely reflective. EUV is a common, well-known and well-understood technical term that refers to light with wavelengths in the range of 124 nm down to 10 nm. For example, the EUV light used in an EUV photomask inspection tool may be 13.5 nm light. The imaging system in an EUV photomask inspection tool includes several reflective EUV mirrors, with no transmissive optics. The illumination path (i.e., the optical path for providing EUV light to the photomask being inspected) and the imaging path (i.e., the optical path for collected light from the photomask being inspected) are spatially separated. These inspection tools therefore have an off-axis imaging design.

Figure 1:
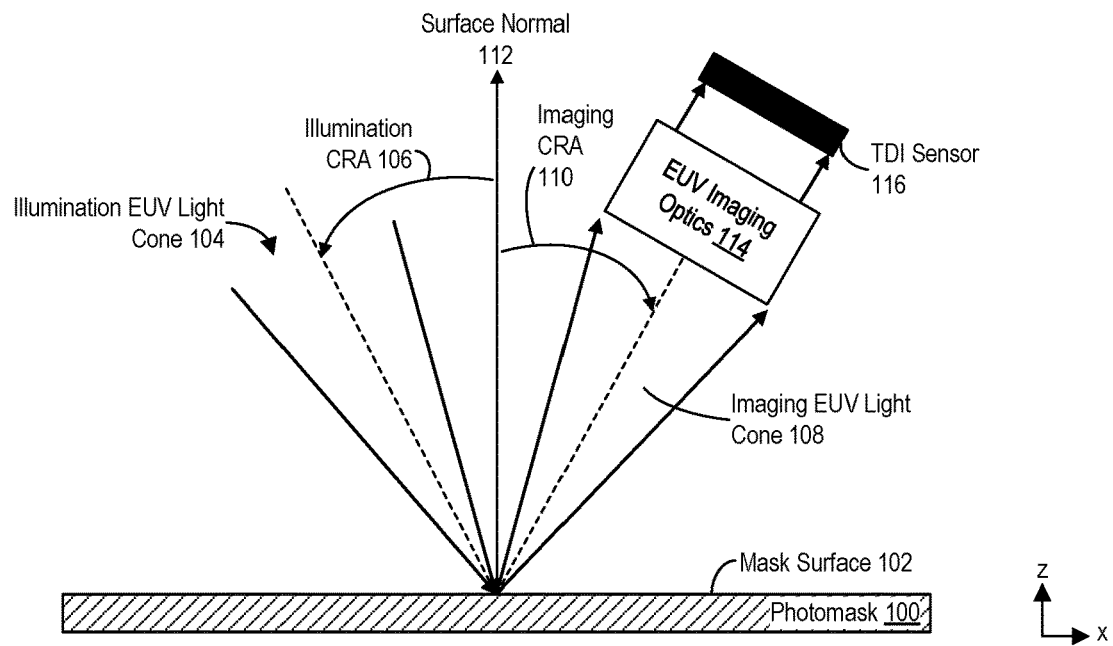
FIG. 1 shows off-axis imaging of a photomask being inspected in an EUV photomask inspection tool, in accordance with some embodiments. Size and angles are not to scale.

FIG. 1 shows off-axis imaging of a photomask 100 being inspected in an EUV photomask inspection tool (e.g., inspection tool 1130, FIG. 11), in accordance with some embodiments. The photomask 100 has a patterned mask surface 102 that is inspected for defects. An illumination EUV light cone 104, generated by an EUV light source (not shown) (e.g., source 402, FIG. 4), is focused onto the patterned mask surface 102, illuminating a small size area (e.g., 200 micron by 200 micron). An imaging EUV light cone 108 coming from the illuminated patterned mask surface 102 is collected and imaged by a TDI sensor 116.

The illumination EUV light cone 104 is spatially separated from the imaging EUV light cone 108. The illumination EUV light cone 104 has a chief ray angle (CRA) 106 from the surface normal 112 (i.e., the normal direction) of the patterned mask surface 102. The imaging EUV light cone 108 has a CRA 110 from the surface normal 112. The numerical aperture (NA) of the imaging path determines the size of the imaging EUV light cone 108. EUV imaging optics 114 in the imaging path (i.e., the path of the imaging EUV light cone 108) focus the imaging EUV light cone 108 onto the TDI sensor 116, illuminating all TDI pixels. The EUV imaging optics 114 include EUV mirrors. The illumination path (i.e., the path of the illumination EUV light cone 104) may also have EUV optics with EUV mirrors used to direct the illumination EUV light cone 104 to the patterned mask surface 102. These mirrors are not shown in FIG. 1 for simplicity.

EUV photomask inspection tools typically perform time-delay-integration (TDI) and thus include TDI image sensors (TDI sensors for short). TDI sensors should be calibrated periodically to ensure that inspection results (e.g., images of inspected photomasks) are accurate. To calibrate a TDI sensor, its linearity is determined. Linearity refers to how accurately the TDI sensor measures the intensity of incident light, for different intensity levels. Quantified inaccuracy indicates a corresponding degree of non-linearity for the TDI sensor. Determining the linearity of a TDI sensor thus involves quantifying any non-linearity for the TDI sensor. The TDI sensor linearity (or equivalently, non-linearity), as determined through calibration, is stored and used to correct subsequent inspection results (e.g., images of photomasks subsequently inspected by the inspection tool).

Calibrating a TDI sensor thus involves generating different intensity levels of EUV light incident on the TDI sensor. Such calibration may be performed in situ in an EUV photomask inspection tool using an EUV test photomask (i.e., calibration photomask) that has a plurality of distinctly patterned regions on its surface to provide different respective intensities of EUV light to the TDI sensor, in response to illumination of respective regions with an EUV beam (e.g., the illumination EUV light cone 104). Different distinctly patterned regions generate (e.g., reflect) different intensities of EUV light when illuminated with the same EUV beam (i.e., with the same EUV beam profile incident on each patterned region).

In some embodiments, the distinctly patterned regions include regions with respective line-space grating patterns (i.e., gratings) of alternating EUV-absorber lines and EUV-reflective areas. The line-space grating patterns of different regions have different absorber duty ratios. In some embodiments, the distinctly patterned regions include EUV-reflective areas with different degrees of reflectivity. In some embodiments, the distinctly patterned regions compose an EUV-reflective area of graded thickness and thus varying reflectivity. In some embodiments, the distinctly patterned regions include EUV-absorber areas with different thicknesses, with each EUV-absorber area situated above an EUV-reflective area.

Figure 2:
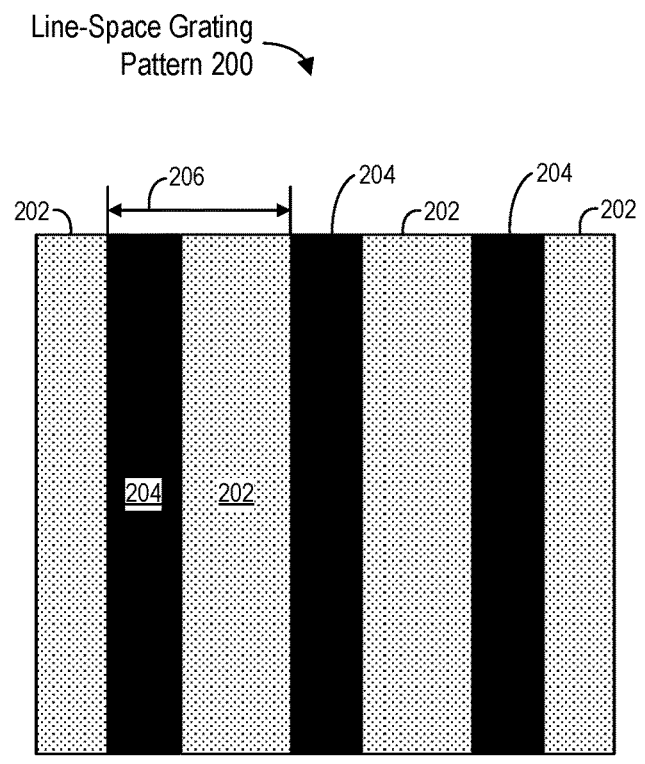
FIG. 2 is a plan view of a line-space grating pattern located in a region on the surface of a test photomask, in accordance with some embodiments.

Line-Space Grating Patterns of Alternating EUV-Absorber Lines and EUV-Reflective Areas FIG. 2 is a plan view of a line-space grating pattern 200 located in a region on the surface of a test photomask in accordance with some embodiments. The line-space grating pattern 200 includes alternating EUV-reflective multi-layer coatings 202 (i.e., mirror coatings) and EUV-absorber lines 204. The periodicity of the EUV-absorber lines 204 (i.e., the spacing between the beginning edge of an EUV-absorber line 204 and the beginning edge of the next EUV-absorber line 204) is the grating pitch 206. The ratio of the width of the EUV-absorber lines 204 (i.e., the EUV-absorber line width) to the pitch is called the absorber duty ratio. (The width is in the x-direction in FIG. 2.) In some embodiments, the EUV-absorber lines 204 are oriented to be perpendicular to the plane formed by the CRAs 106 and 110 (FIG. 1) of the illumination and imaging paths during calibration.

Figure 3:
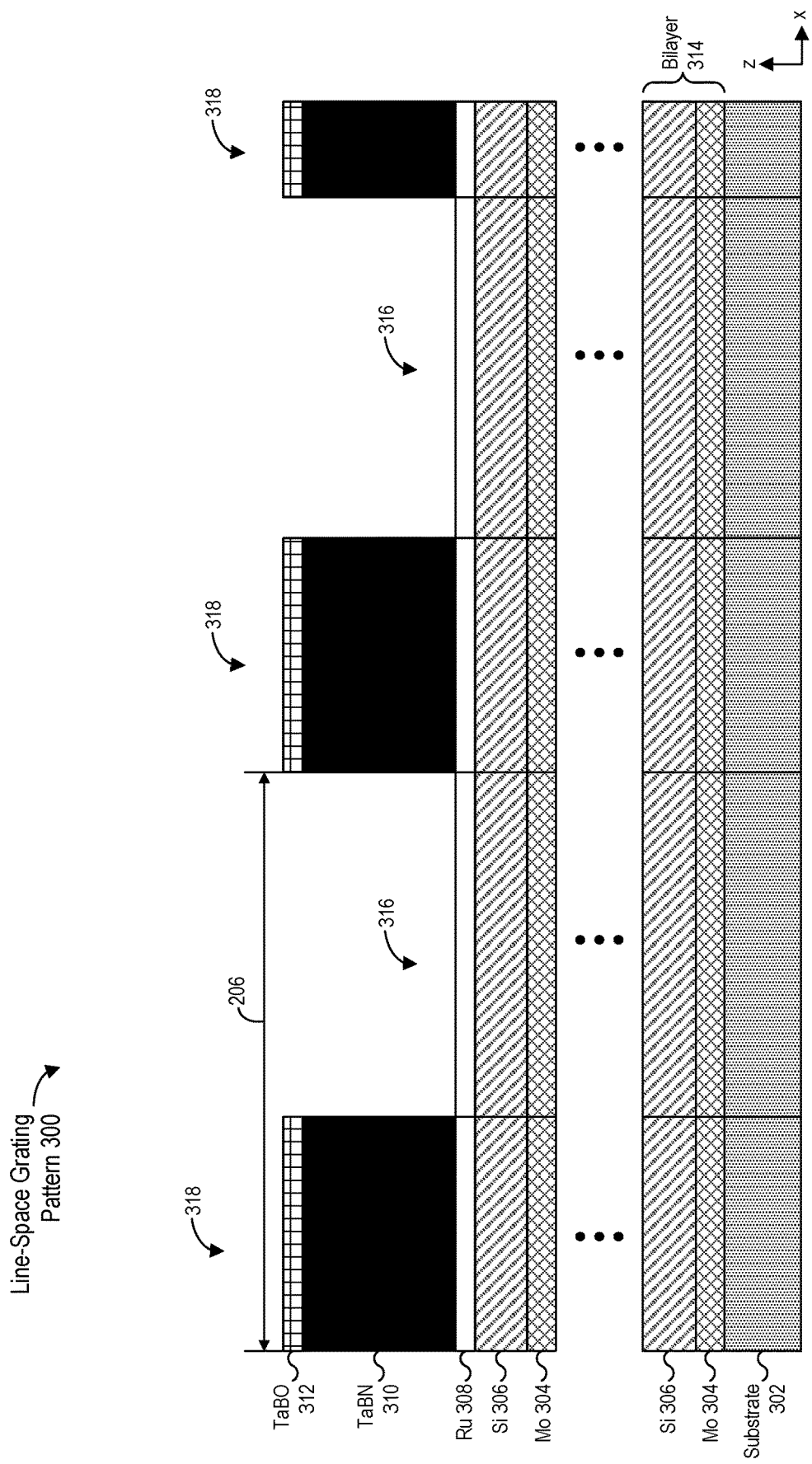
FIG. 3 is a cross-sectional view of a line-space grating pattern located in a region on the surface of a test photomask, in accordance with some embodiments.

FIG. 3 is a cross-sectional view of a line-space grating pattern 300 located in a region on the surface of a test photomask, in accordance with some embodiments. The line-space grating pattern 300, which is an example of the line-space grating pattern 200 (FIG. 2), includes alternating EUV-reflective multi-layer coatings 316 and EUV-absorber lines 318 with a grating pitch 206. The EUV-reflective multi-layer coatings 316 and EUV-absorber lines 318 are examples of the EUV-reflective multi-layer coatings 202 and EUV-absorber lines 204 (FIG. 2), respectively.

The EUV-reflective multi-layer coatings 316 (effectively a single multi-layer coating divided into different EUV-reflective areas by the EUV-absorber lines 318) include alternating layers of molybdenum (Mo) 304 and silicon (Si) 306 above a substrate (e.g., a blank photomask) 302, with a capping layer 308 covering the alternating layers of Mo 304 and Si 306. The capping layer 308 may be ruthenium (Ru) or boron (B). Each pair of adjacent Mo 304 and Si 306 layers is called a MoSi bilayer 314. In some embodiments, the Mo layer 304 thickness is 2.8 nm, the Si layer 306 thickness is 4.2 nm, and the capping layer 308 thickness is 2.5 nm. (Thicknesses are in the z-direction in FIG. 3.) The EUV-reflective multi-layer coatings 316 are not perfectly reflecting but are partially reflecting for EUV light. (Reflectivity of multi-layer coatings 316 is discussed below with respect to FIG. 6.) The number of MoSi bilayers 314 is chosen to provide a relatively high degree of reflectivity (e.g., at least 60% or at least 65% reflectivity). In some embodiments, the number of MoSi bilayers 314 in the line-space grating pattern 300 is 40, or 40-45, or 35-40, or 50.

The EUV-absorber lines 318 are situated above the multi-layer coating 316. The EUV-absorber lines 318 include a tantalum boron nitride (TaBN) layer 310 above the capping layer 308 and a tantalum boron oxide (TaBO) capping layer 312 above the TaBN layer 310. In some embodiments, the TaBO capping layer 312 has a thickness of 2 nm. TaBN is a strongly EUV-absorbing material. The thickness of the TaBN layer 310 is variable and is chosen to absorb substantially all incident EUV light (e.g., in accordance with FIG. 9, as discussed below). In some embodiments, the TaBN layer 310 has a thickness of 70-80 nm.

Different regions on the surface of the test photomask have respective line-space grating patterns 200 (FIG. 2) (e.g., line-space grating patterns 300, FIG. 3) with distinct absorber duty ratios (i.e., different respective absorber duty ratios). For example, respective line-space grating patterns 200 (FIG. 2) (e.g., line-space grating patterns 300, FIG. 3) on the surface of the test photomask have distinct respective EUV-absorber line 318 widths but have identical grating pitches 206. (Widths are in the x-direction in FIGS. 2 and 3.) The width of the EUV-absorber lines 318 thus may vary between regions while being constant within a particular region, while the pitch 206 may be constant across the regions.

Figure 4:
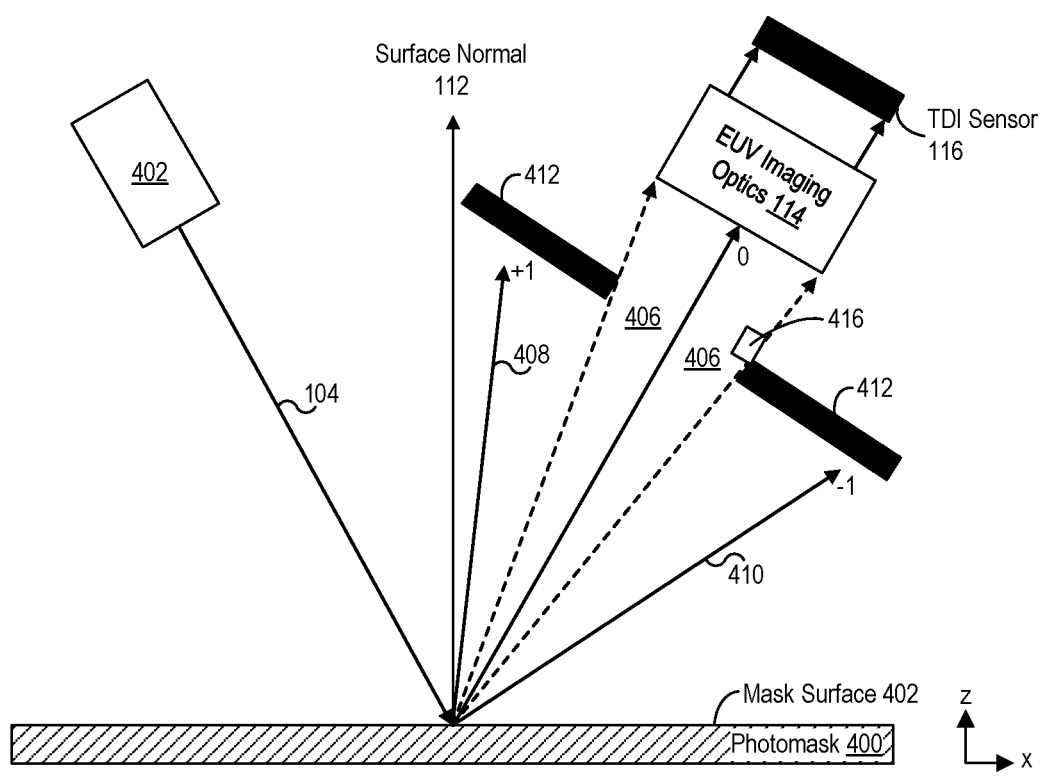
FIG. 4 shows off-axis imaging of a test photomask, in accordance with some embodiments. Size and angles are not to scale.

FIG. 4 shows off-axis imaging of a test photomask 400 with line-space grating patterns 200 (FIG. 2) (e.g., line-space grating patterns 300, FIG. 3) on its surface 402, in accordance with some embodiments. The grating patterns 200 are in the x-y plane, which is perpendicular to the page for FIG. 4, and are not visible in FIG. 4. A small area (e.g., 200 micron by 200 micron), of the grating pattern 200 is illuminated with the illumination EUV light cone 104 (shown as a single arrow in FIG. 4 for simplicity), which is generated by an EUV light source 402. The grating pattern 200 generates multiple orders of diffraction beams, including a zeroth-order beam 406 (m=0) (i.e., the simple reflection of the illumination EUV light cone 104 from the grating surface), a positive first-order (m=+1) diffraction beam 408, and a negative first-order (m=−1) diffraction beam 410. An opaque aperture 412 is installed in the imaging path to block the first-order diffraction beams 408 and 410 and to select the zeroth-order beam 406. The zeroth-order beam 406, as focused onto a TDI sensor 116 by EUV imaging optics 114, is imaged by the TDI sensor 116. In some embodiments, the zeroth-order beam 406 illuminates, and is imaged using, all TDI pixels in the TDI sensor 116. A calibrated reference intensity detector 416 is installed in the imaging path (e.g., at or near the edge of the zeroth-order beam 406) to detect the intensity of the zeroth-order beam 406 (i.e., the intensity of the portion of the profile of the zeroth-order beam 106 that is incident on the reference intensity detector 416). In some embodiments, the reference intensity detector 416 is situated at the edge of the aperture 412. For example, the reference intensity detector 416 may be attached to the aperture 412 (e.g., extends into the zeroth-order beam 106 from the edge of the aperture 412).

In some embodiments, the aperture 412 is removable from the inspection tool: the aperture 412 may be installed in the inspection tool to perform calibration and then removed from the inspection tool after calibration is complete and before the inspection tool is subsequently used to inspect production photomasks. In some embodiments, the aperture 412 is permanently installed in the inspection tool: the aperture 412 may be moveable within the inspection tool, such that it can be moved into the imaging path during calibration and moved out of the imaging path for inspection of production photomasks. In some embodiments, the reference intensity detector 416 is removable from the inspection tool: it may be installed in the inspection tool to perform calibration and then removed from the inspection tool after calibration is complete and before the inspection tool is subsequently used to inspect production photomasks. A single removeable reference intensity detector 416 may be used to calibrate multiple inspection tools. In some embodiments, the reference intensity detector 416 has been calibrated by a certified or official standards body (e.g., the National Institute of Standards and Technology (NIST) or similar governmental standards agency).

Different line-space grating patterns 200 (FIG. 2) (e.g., line-space grating patterns 300, FIG. 3) with different absorber duty ratios may be situated in different regions of the test photomask 400. To calibrate the TDI sensor 116, these different regions may be illuminated and imaged in turn using the off-axis imaging shown in FIG. 4. The imaging results obtained using the TDI sensor 116 are compared to the intensities detected by the reference intensity detector 416. The linearity of the TDI sensor 116 is determined through this comparison.

The TDI sensor 116 can work in two modes: frame image mode and scan mode. In frame image mode, all the pixels of the TDI sensor 116 capture their own light intensity, called a frame, in a short time period (e.g., from 0.001 ms to several milliseconds) simultaneously and no pixel-to-pixel integration happens. In scan mode, pixel-to-pixel light intensity is integrated in the direction of scan (e.g., the x-direction). Scan mode is typically used in production photomask inspection. For TDI linearity calibration, frame image mode may be used in order to calibrate the response linearity of pixels (e.g., of each pixel). The TDI response linearity of scan mode can be calculated from the pixel-level linearity as measured in frame image mode.

When line-space grating patterns 200 of different absorber duty ratios are illuminated, the respective diffraction angles of the first-order diffraction beams 408 and 410 are the same for the different patterns, because the pitch 206 is the same, in accordance with some embodiments. (But the angle of the positive first-order diffraction beam 408 is generally different from the angle of the negative first-order diffraction beam 410.) The intensity of the zeroth-order diffraction beam 406 changes, however, because the width of the EUV-absorber lines 204 changes (e.g., the area of the multi-layer coating 316 covered by EUV-absorber lines 318 changes). The beam profile of the zeroth-order diffraction beam 406 remains the same as the illumination beam, because effectively it is the simple reflection of the incident beam (i.e., of the illumination EUV light cone 104). Therefore, by selecting a particular line-space grating pattern 200, the intensity of EUV light provided to the TDI sensor 116 can be controlled without changing the incident-beam profile for TDI linearity calibration.

For the opaque aperture 412 to select a clean zeroth-order diffraction beam 406, the illumination parameter σ should be small enough that the overlap between the zeroth-order diffraction beam 406 and the two first-order diffraction beams 408 and 410 is also small. Table 1 shows calculated maximum values of σ for different grating pitches 206. In these calculations, the imaging NA is assumed to be 0.2 and the CRA is 8.15° for both the illumination and imaging paths.

TABLE 1

Maximum Illumination Parameter σ for Different Grating Pitches

| Pitch (nm) | CRA: m = +1 order | CRA: m = 0 order | CRA: m = −1 order | Maximum σ |
|---|---|---|---|---|
| 120 | 1.68 | 8.15 | 14.73 | 0.28 |
| 100 | 0.39 | 8.15 | 16.07 | 0.34 |
| 80 | −1.55 | 8.15 | 18.09 | 0.42 |
| 60 | −4.77 | 8.15 | 21.52 | 0.56 |

The three central columns of Table 1 are the CRAs of the three diffraction orders calculated using the grating equation for an illumination CRA of 8.15°. The maximum value of σ is calculated by taking the smaller of the two half-angles between the m=0 CRA and m=+/−1 CRAs, and dividing it by the half angle of the solid angle for the NA. For example, for an 80 nm pitch, the CRA difference between the m=0 and m=+1 diffraction orders is 9.7° deg and the CRA difference between the m=0 and m=−1 diffraction orders is 9.94°. The smaller CRA difference of 9.7° is selected. If the illumination EUV light cone 104 has a half angle of 9.7°/2=4.85°, then there will be no overlapping between the three diffraction orders. This condition corresponds to an illumination σ=4.85°/11.5°=0.42, where 11.5° is the half angle of the solid angle for NA=0.2. If σ is larger than 0.42, then a smaller aperture is needed to select a pure zeroth-order diffraction beam 406.

In Table 2, the zeroth-order effective reflectivity for line-space grating patterns 300 (FIG. 3) is calculated for different absorber duty ratios and line-space grating pitches 206. This effective reflectivity is normalized to the reflectivity of a pure multi-layer coating 316 (i.e., in the complete absence of EUV-absorber lines 318, FIG. 3, such that the absorber duty ratio is zero) at a 13.5 nm wavelength and 8.15° angle of incidence. In the calculations, the EUV light is assumed to be non-polarized and an absorber thickness (i.e., thickness of the TaBN layer 310) of 70 nm is used. For each value of the pitch 206 as shown in the first column, the zeroth-order normalized effective reflectivity is calculated for absorber duty ratios of 0.8, 0.65, 0.5, 0.35, 0.2, and 0. The two extreme cases of absorber duty ratio are pure absorber (e.g., the multi-layer coating 316, FIG. 3, is completely covered by an EUV absorber) and pure EUV-reflective multi-layer coating (e.g., the entire multi-layer coating 316, FIG. 3, is exposed, with no EUV absorber present), giving minimum and maximum light intensities respectively. The different reflectivities shown in Table 2 demonstrate the ability to generate EUV light of different intensities, since the intensity corresponds to the reflectivity for a given intensity of incident light (i.e., for a given illumination EUV light cone 104). In this calibration, the focus change caused by different absorber line duty ratios should be corrected during imaging by the TDI sensor 116.

TABLE 2

Reflectivity vs. Absorber Duty Ratio by Pitch

| Pitch | Zeroth-order effective reflectivity (normalized) vs. absorber duty ratio | | | | | |
|---|---|---|---|---|---|---|
| (nm) | 0.8 | 0.65 | 0.5 | 0.35 | 0.2 | 0 |
| 120 | 0.013 | 0.035 | 0.108 | 0.242 | 0.485 | 1 |
| 100 | 0.016 | 0.034 | 0.099 | 0.240 | 0.486 | 1 |
| 80 | 0.023 | 0.037 | 0.096 | 0.240 | 0.492 | 1 |
| 60 | 0.037 | 0.061 | 0.129 | 0.267 | 0.511 | 1 |

As the line width of EUV-absorber lines 204 (FIG. 2) (e.g., EUV-absorber lines 318, FIG. 3) gets narrower and narrower, fabrication of the line-space grating pattern 200 (FIG. 2) (e.g., the line-space grating pattern 300, FIG. 3) becomes more difficult. Using a larger grating pitch 206 makes fabrication easier, but the maximum allowed illumination α is smaller, as shown in Table 1. As a rule of thumb, the narrowest absorber line that can be fabricated on an EUV photomask is one-third of the absorber thickness. If the absorber thickness (i.e., absorber line height) (e.g., thickness of the TaBN layer 310) is 70 nm, then the narrowest practical absorber line has a width of 23.3 nm, which corresponds to a duty ratio of 0.29 for 80 nm pitch 206. For small-pitch line-space grating patterns, the absorber thickness (absorber line height) may be reduced for optimum zeroth-order effective reflectivity and ease of grating-pattern fabrication.

EUV-Reflective Areas with Different Degrees of Reflectivity

Figure 5A:
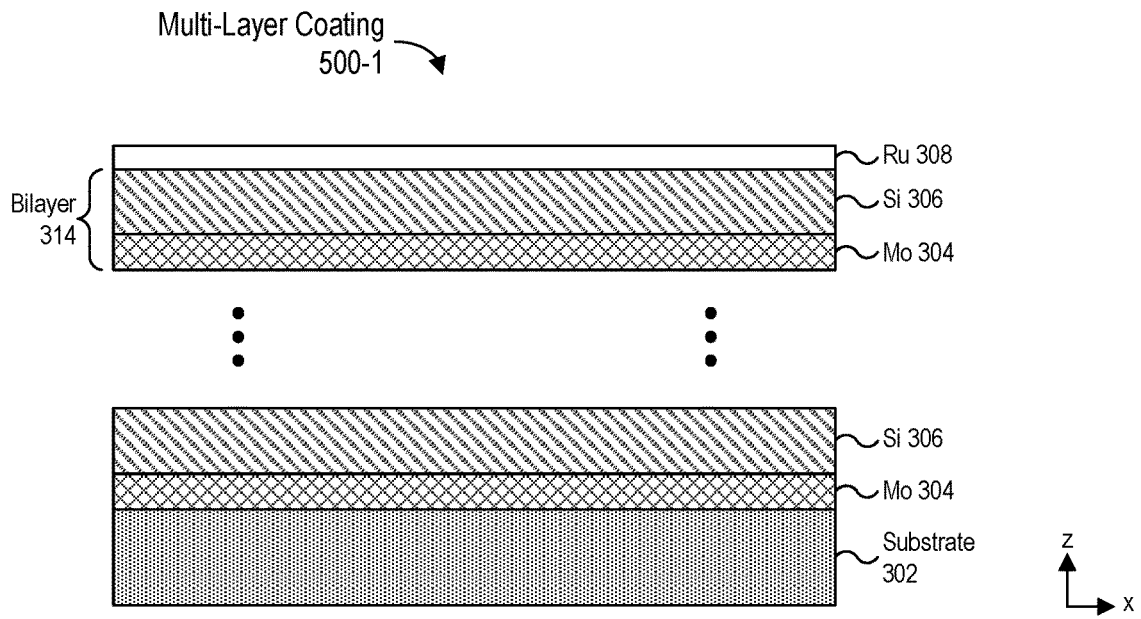
FIGS. 5A and 5B are cross-sectional views of respective multi-layer coatings that serve as EUV-reflective areas with different degrees of reflectivity on the surface of a test photomask, in accordance with some embodiments.
Figure 5B:
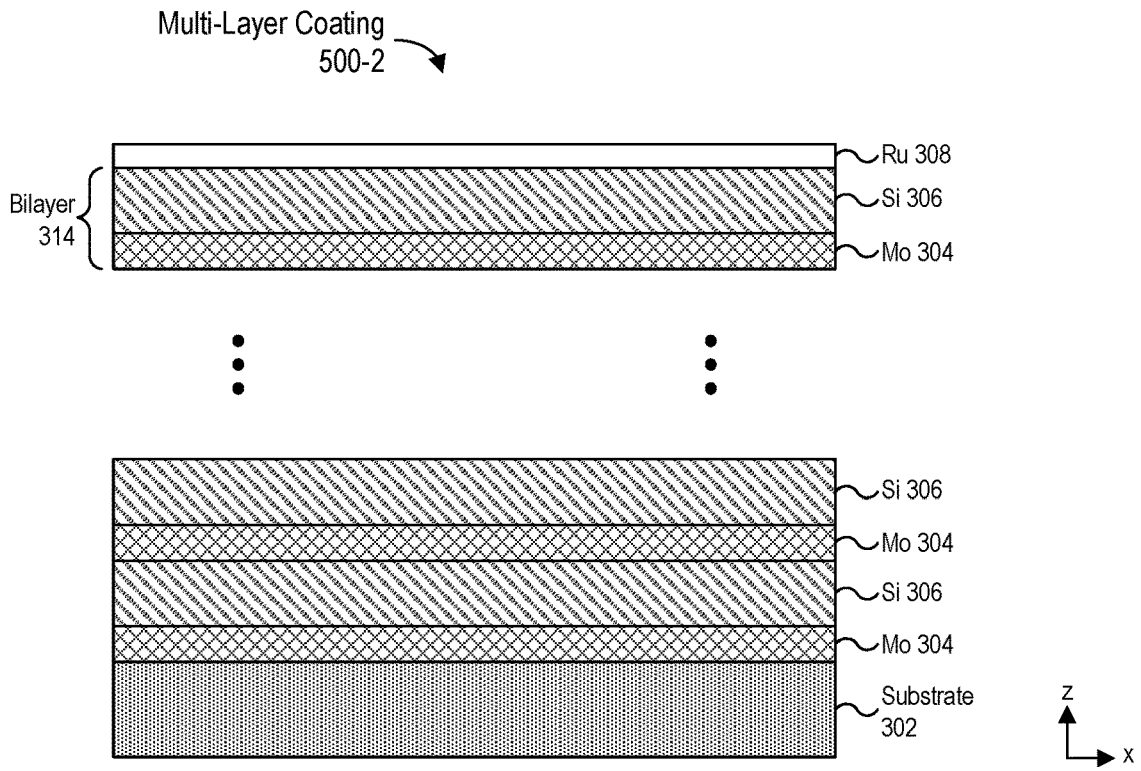

FIGS. 5A and 5B are cross-sectional views of respective multi-layer coatings 500-1 and 500-2 that serve as EUV-reflective areas with different degrees of reflectivity (i.e., different reflectivities) in respective regions on the surface of a test photomask, in accordance with some embodiments. The multi-layers coatings 500-1 and 500-2 may have the same structure and/or layer thicknesses as the multi-layer coatings 316 (FIG. 3). The multi-layer coating 500-2 (FIG. 5B) has more Mo layers 304 and Si layers 306, and thus more MoSi bilayers 314, than the multi-layer coating 500-1 (FIG. 5A). Other regions on the surface of the test photomask may have multi-layer coatings 500 with distinct respective (i.e., different) numbers of Mo layers 304 and Si layers 306, and thus distinct respective numbers of MoSi bilayers 314. In general, EUV-reflective multi-layer coatings in distinct respective regions on the surface of the test photomask have distinct respective numbers of layers.

Figure 6:
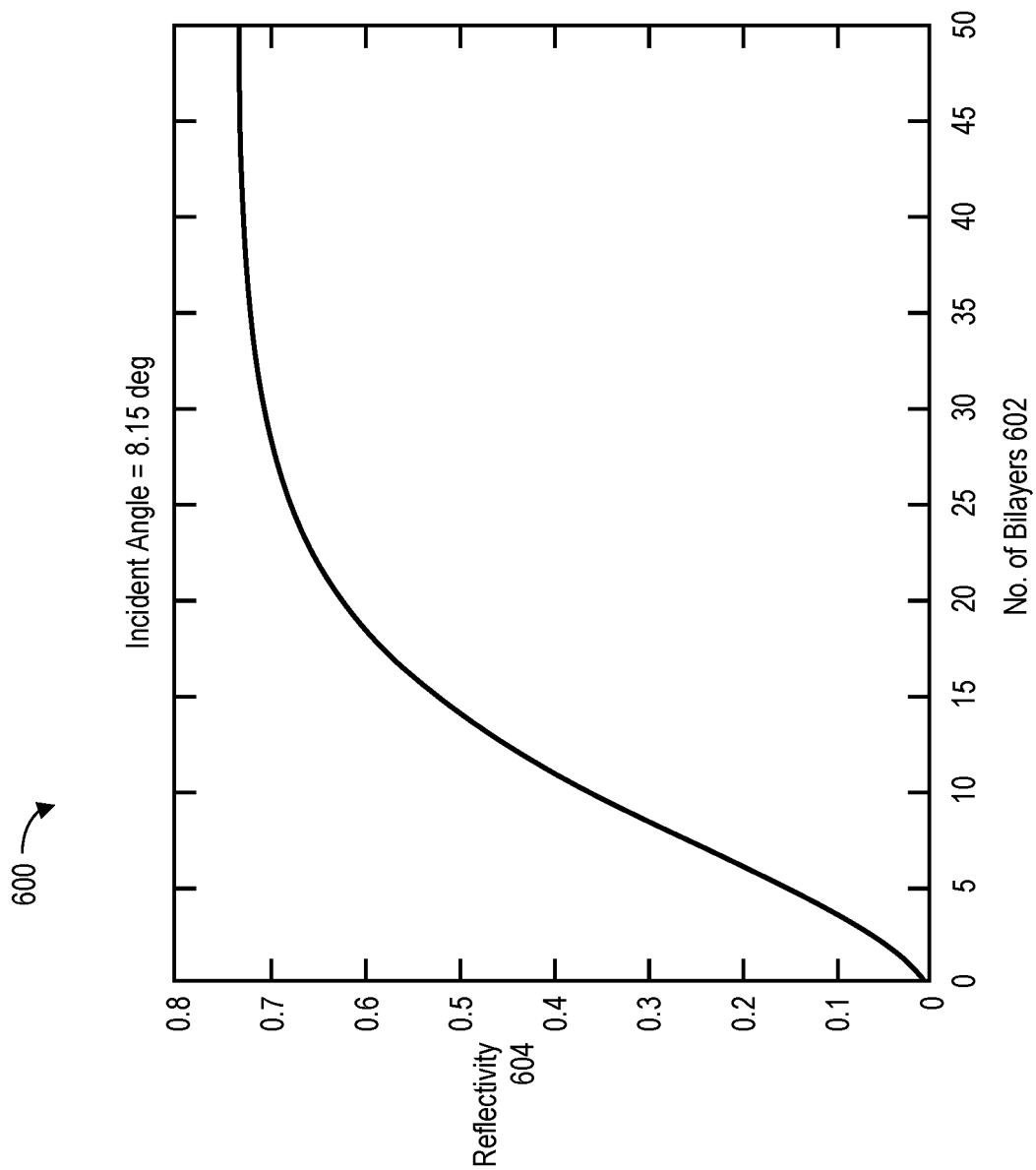
FIG. 6 is a plot of calculated reflectivity of multi-layer coatings versus the number of bilayers in the coatings, in accordance with some embodiments.

The EUV reflectivity of the multi-layers coatings 500-1 and 500-2 is a function of the number of MoSi bilayers 314. FIG. 6 is a plot 600 of the calculated reflectivity 604 of multi-layer coatings 500 versus the number 602 of bilayers 314. The calculations behind the plot 600 assume non-polarized 13.5 nm light at an angle of incidence of 8.15° and layer thickness as described for FIG. 3. FIG. 6 shows that a theoretical reflectivity of over 70% may be achieved. In practice, a reflectivity of at least 65% may be achieved with a sufficient number 602 of bilayers 314 (e.g., with 40 or more bilayers 314). Table 3 summarizes the calculated reflectivity of several bilayer numbers, normalized to the reflectivity of a 40-bilayer multi-layer coating 500.

TABLE 3

Number of MoSi Bilayers versus Normalized Reflectivity

| | No. of MoSi bilayer | | | | | | |
|---|---|---|---|---|---|---|---|
| | 2 | 4 | 6 | 8 | 11 | 16 | 22 | 40 |
| Normalized Reflectivity | 0.06 | 0.15 | 0.26 | 0.37 | 0.53 | 0.74 | 0.88 | 1 |

A test photomask with multi-layer coatings 500 of differing numbers of layers (and thus differing numbers of bilayers 314) in respective regions on its surface may be used in the off-axis imaging arrangement of FIG. 4 to calibrate a TDI sensor 116. The aperture 412 may be omitted from the off-axis imaging arrangement, because there is no grating and thus no diffraction of the illumination EUV light cone 104. By selecting different regions on the surface of the test photomask for illumination and imaging, the intensity of EUV light provided to the TDI sensor 116 can be varied in a controlled manner for a given illumination EUV light cone 104 during calibration. The focus offset caused by varying numbers of bilayers should be corrected during imaging by the TDI sensor 116.

An EUV-Reflective Area of Graded Thickness

One variation of the use of multi-layer coatings (e.g., multi-layers coatings 500-1 and 500-2, FIGS. 5A-5B) with different numbers of bilayers is to fabricate a graded multi-layer coating on the surface of the test photomask. The grading results in different (average) bilayer thicknesses for different regions on the surface of the test photomask while keeping the thickness ratio between the layers in each bilayer the same (i.e., constant). In a graded multi-layer coating, different bilayer thicknesses correspond to different wavelengths of peak reflectivity. Therefore, if the wavelength and angle of incidence are the same, different bilayer thicknesses give different reflectivities. When different areas of a graded multi-layer coating are imaged by the TDI sensor 116 (e.g., using the off-axis arrangement of FIG. 4, but without the aperture 412), the intensity of EUV light reflected by the coating changes (e.g., for a given illumination EUV light cone 104).

Figure 7:
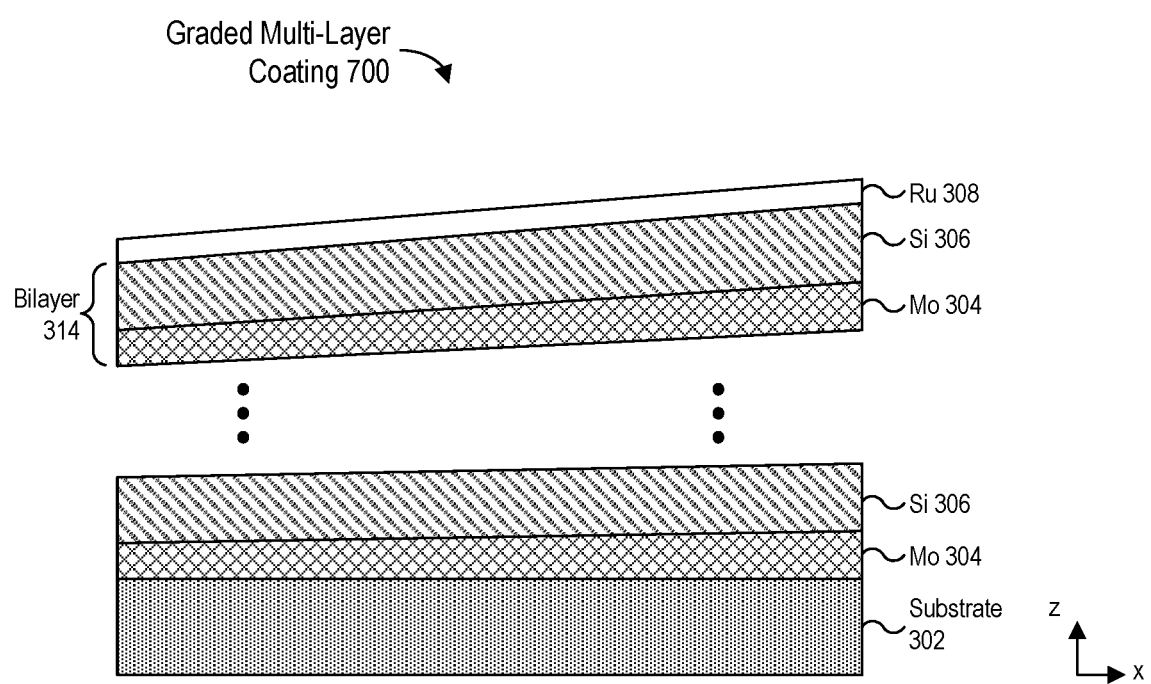
FIG. 7 is a cross-sectional view of a graded multi-layer coating on the surface of a test photomask, in accordance with some embodiments.

FIG. 7 is a cross-sectional view of a graded multi-layer coating 700 on the surface of a test photomask, in accordance with some embodiments. The multi-layer coating 700 may have the same structure as the multi-layer coatings 316 (FIG. 3) and has a specified number of bilayers 314 (e.g., 40 bilayers 314). In some embodiments, the thickness of the MoSi bilayers 314 (e.g., of both the alternating Mo layers 304 and Si layers 306) changes in a first direction (e.g., the x-direction) and is uniform in a second direction that is perpendicular to the first direction (e.g., the y-direction, which is perpendicular to the page for FIG. 7). The thickness ratio between the Si layers 306 and Mo layers 304 remains constant throughout the multi-layer coating 700 (e.g., with the thickness ratio being the same as for multi-layer coatings 500-1 and 500-2, FIGS. 5A-5B).

The bilayer thickness change of the graded multi-layer coating 700 is small enough that the thickness can be treated as constant within a field of view (FOV) (e.g., 200 micron× 200 micron) for the TDI sensor 116. Thus, for each pixel of the TDI sensor 116, the reflectivity (i.e., intensity scaling factor) is effectively the same for a given region on the surface of the test photomask. The focus offset caused by the changing thickness of the graded multi-layer coating 700 should be corrected during imaging by the TDI sensor 116.

Figure 8A:
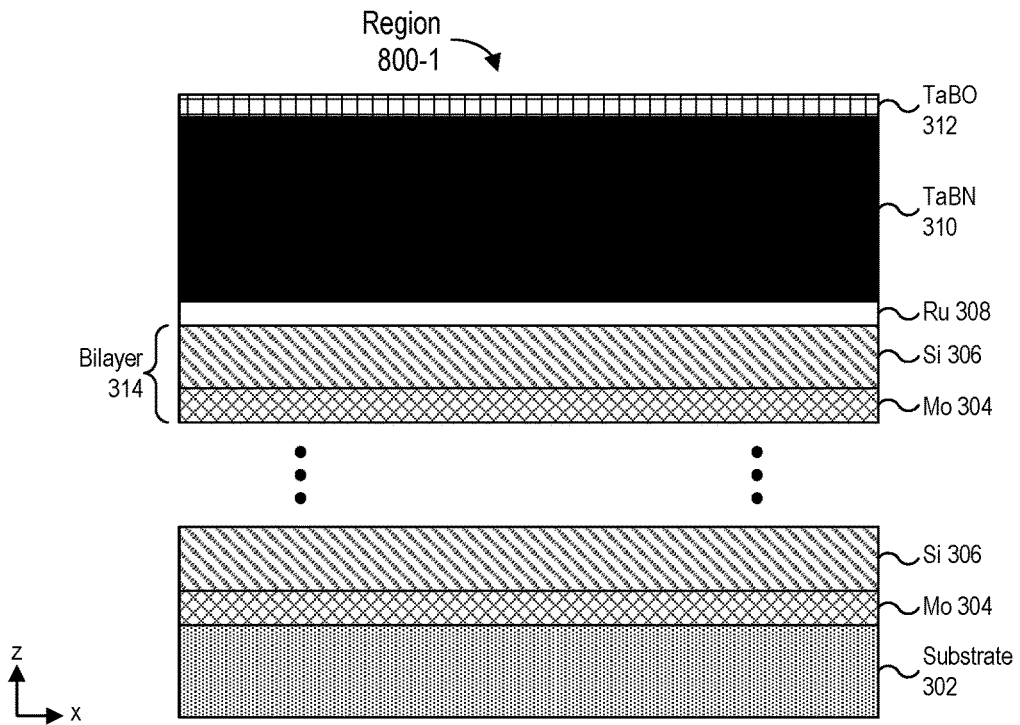
FIGS. 8A-8B are cross-sectional views of respective regions on the surface of a test photomask with respective EUV-absorber areas of differing thicknesses disposed on respective EUV-reflective multi-layer coatings, in accordance with some embodiments.
Figure 8B:
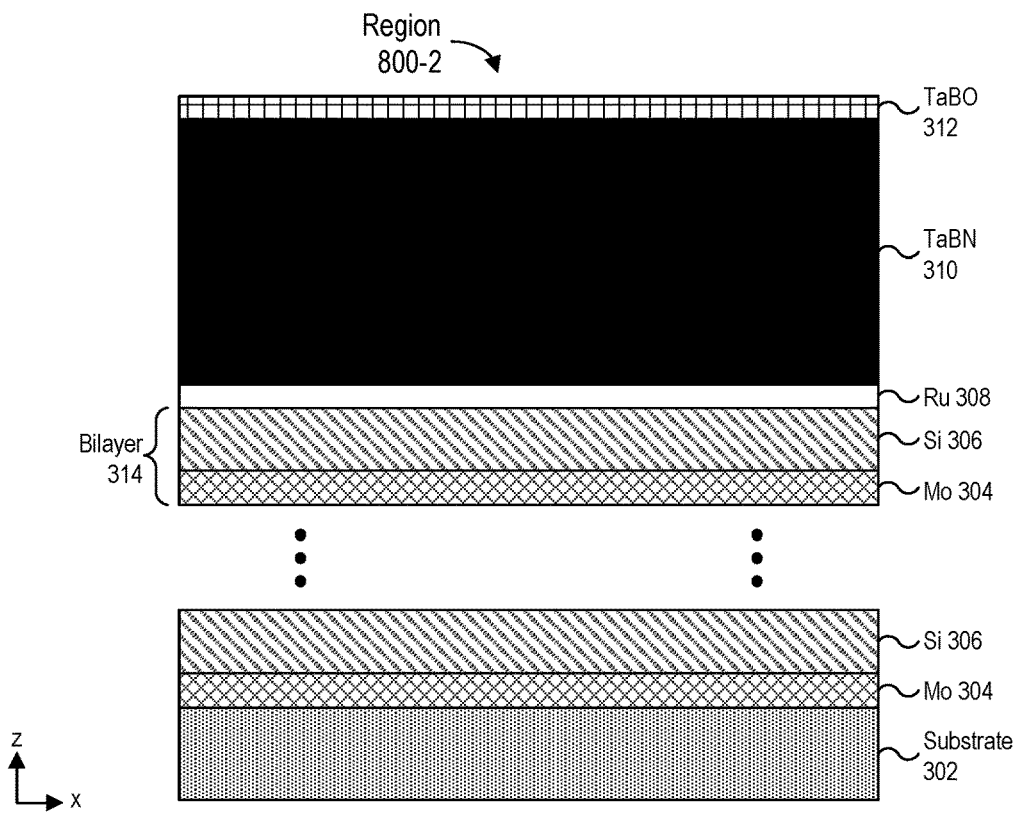

EUV-Absorber Areas with Different Thicknesses, Situated Above EUV-Reflective Areas Another technique of in situ EUV light-intensity control is to use pure absorber areas of different absorber thicknesses in respective regions on the surface of a test photomask. The absorber areas are situated above EUV-reflective multi-layer coatings. FIGS. 8A-8B are cross-sectional views of respective regions 800-1 and 800-2 on the surface of a test photomask in accordance with some embodiments. The regions 800-1 and 800-2 include respective EUV-absorber areas and respective EUV-reflective multi-layer coatings, with the EUV-absorber area of each region 800 situated above the EUV-reflective multi-layer coating area of the region 800. In some embodiments, the EUV-reflective multi-layer coatings of the regions 800-1 and 800-2 have the same structure and/or layer thicknesses as the multi-layer coatings 316 (FIG. 3): a series of MoSi bilayers 314 are disposed on a substrate 302 and are covered by a capping layer 308. The Mo layer 304 thickness may be 2.8 nm, the Si layer 306 thickness may be 4.2 nm, and the capping layer 308 thickness may be 2.5 nm. (Thicknesses are in the z-direction in FIGS. 8A-8B.) Each region 800 (e.g., both the region 800-1 and 800-2) may have the same number of MoSi bilayers 314 (e.g., 40 bilayers 314, or 40-45 bilayers 314, or 35-40 bilayers 314). The EUV-absorber areas may have the same structure as EUV-absorber lines 318 (FIG. 3): a TaBN layer 310 is disposed above the capping layer 308 and is covered by a TaBO capping layer 312 (e.g., with a 2 nm thickness). The thickness of the TaBN layer 310 is different for different regions 800. For example, the TaBN layer 310 in the region 800-2 (FIG. 8B) is thicker than the TaBN layer 310 in the region 800-1 (FIG. 8A). Changing the thickness of the TaBN layer 310 changes the reflectivity of the entire structure.

Figure 9:
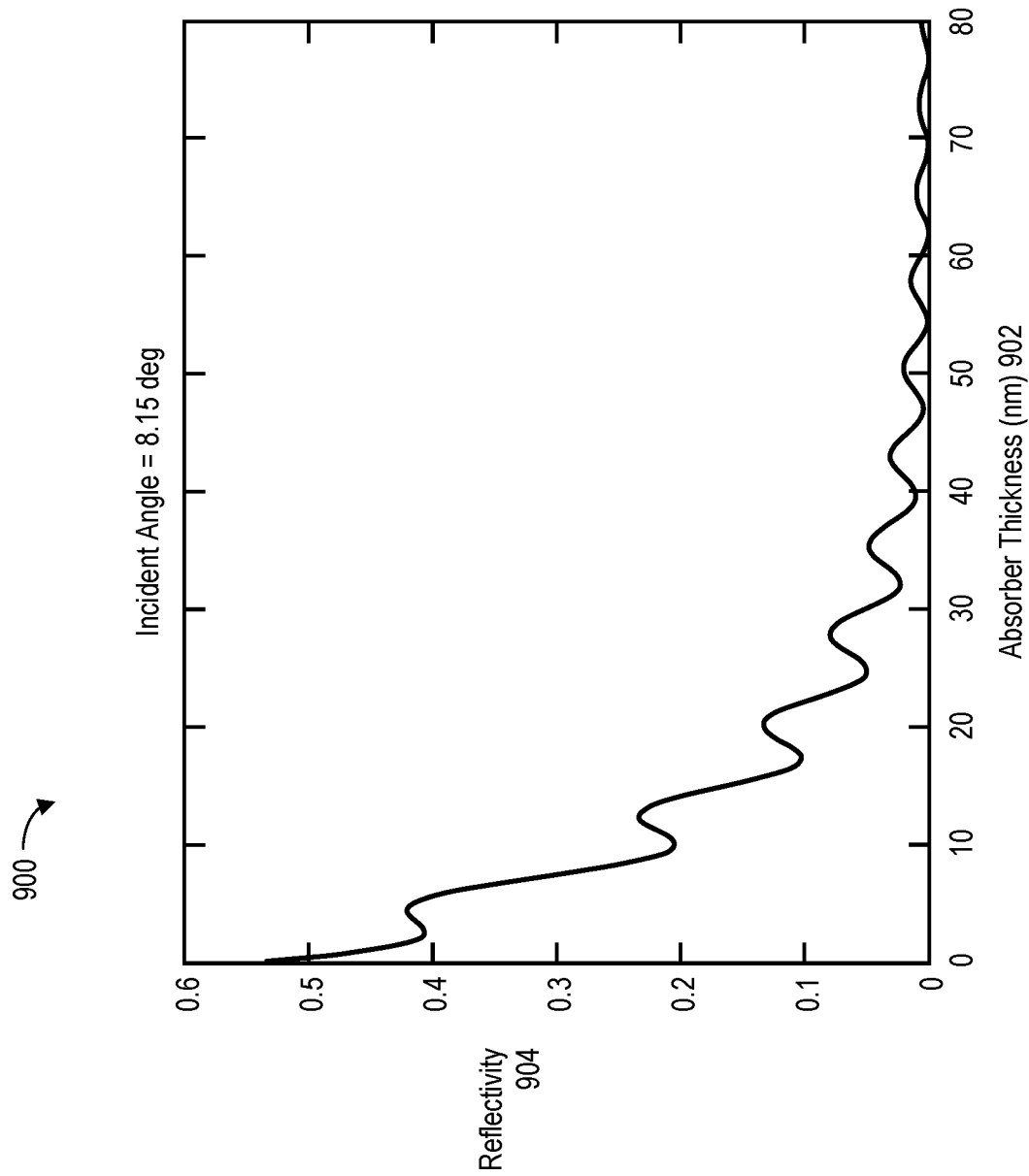
FIG. 9 is a plot of the calculated reflectivity of the structure of FIGS. 8A-8B versus the thickness of the EUV absorber, in accordance with some embodiments

FIG. 9 is a plot 900 of the calculated reflectivity 904 of the structure of FIGS. 8A-8B versus the thickness 902 of the TaBN layer 310, in accordance with some embodiments. The calculations behind FIG. 9 assume non-polarized 13.5 nm light with an angle of incidence of 8.15°, 40 MoSi bilayers 314, and a fixed thickness of the TaBO capping layer 312. FIG. 9 illustrates the etalon effect in the reflectivity curve, with a changing period about 7.2 nm ($\approx \lambda/2$): the reflectivity rises somewhat after dropping with increasing thickness 902, before dropping again. Table 4 summarizes the normalized reflectivity (normalized with respect to the reflectivity of the EUV-reflective multi-layer coating in the absence of the TaBN layer 310) versus the thickness 902 of the TaBN layer 310.

TABLE 4

Normalized Reflectivity Versus Absorber Thickness

| | TaBN Thickness (nm) | | | | | | | |
|---|---|---|---|---|---|---|---|---|
| | 0 | 4 | 8 | 12 | 24 | 40 | 58 | 68 |
| Normalized Reflectivity | 1 | 0.72 | 0.58 | 0.46 | 0.24 | 0.10 | 0.039 | 0.023 |

A test photomask with regions 800 (e.g., including regions 800-1 and 800-2) that have respective EUV-absorber areas of differing thicknesses may be used in the off-axis imaging arrangement of FIG. 4 to calibrate a TDI sensor 116. The aperture 412 may be omitted from the off-axis imaging arrangement, because there is no grating and thus no diffraction of the illumination EUV light cone 104. By selecting different regions for illumination and imaging, the intensity of EUV light provided to the TDI sensor 116 can be varied in a controlled manner for calibration. The focus offset caused by the different absorber thicknesses should be corrected when imaging the regions 800 using the TDI sensor 116.

Method Flowchart

Figure 10:
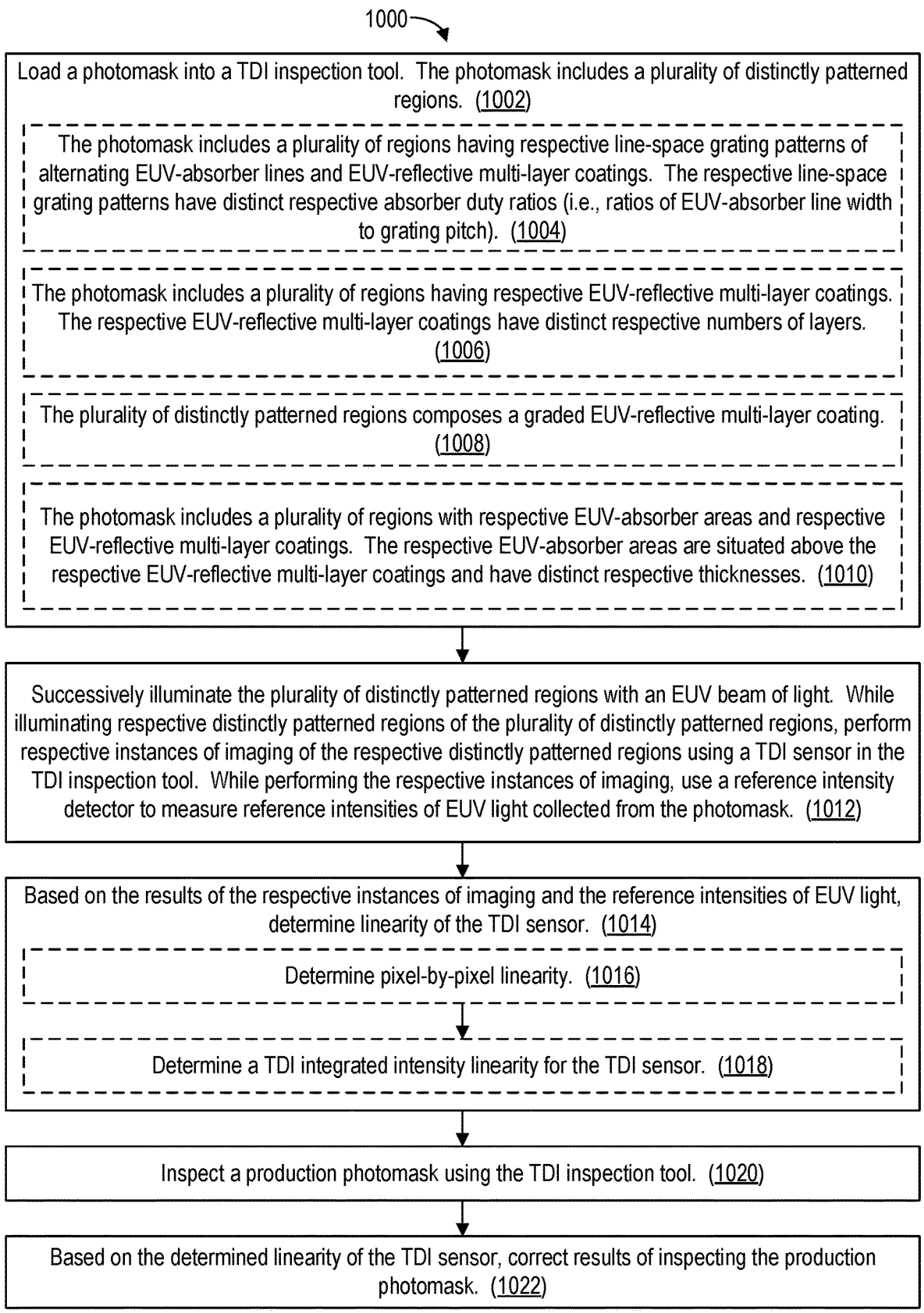
FIG. 10 is a flowchart showing a method of calibrating and using an EUV photomask inspection tool in accordance with some embodiments.

FIG. 10 is a flowchart showing a method 1000 of calibrating and using an EUV photomask inspection tool (e.g., inspection tool 1130, FIG. 11) in accordance with some embodiments. In the method 1000, a photomask (e.g., test photomask 400, FIG. 4) that includes a plurality of distinctly patterned regions is loaded (1002) into a TDI inspection tool. In some embodiments, the photomask includes (1004) a plurality of regions with respective line-space grating patterns of alternating EUV-absorber lines and EUV-reflective multi-layer coatings (e.g., line-space grating patterns 200, FIG. 2; line-space grating patterns 300, FIG. 3). The respective line-space grating patterns have distinct respective absorber duty ratios (i.e., ratios of EUV-absorber line width to grating pitch). For example, the respective line-space grating patterns may have distinct respective EUV-absorber line widths but identical grating pitches. In some embodiments, the photomask includes (1006) a plurality of regions having respective EUV-reflective multi-layer coatings (e.g., multi-layer coatings 500-1 and 500-2, FIGS. 5A-5B). The respective EUV-reflective multi-layer coatings have distinct respective numbers of layers (e.g., distinct respective numbers of MoSi bilayers 314, FIGS. 5A-5B). In some embodiments, the plurality of distinctly patterned regions composes (1008) a graded EUV-reflective multi-layer coating (e.g., graded multi-layer coating 700, FIG. 7). In some embodiments, the photomask includes (1010) a plurality of regions with respective EUV-absorber areas and respective EUV-reflective multi-layer coatings (e.g., regions 800-1 and 800-2, FIGS. 8A-8B). The respective EUV-absorber areas are situated above the respective EUV-reflective multi-layer coatings and have distinct respective thicknesses.

The plurality of distinctly patterned regions is successively illuminated (1012) with an EUV beam of light (e.g., illumination EUV light cone 104, FIG. 4) (e.g., 13.5 nm light, which may be non-polarized): each distinctly patterned regions is illuminated with the EUV beam in turn. While illuminating respective distinctly patterned regions of the plurality of distinctly patterned regions, respective instances of imaging of the respective distinctly patterned regions are performed (1012) using a TDI sensor (e.g., TDI sensor 116, FIG. 4) in the TDI inspection tool. The respective instances of imaging may be performed in frame image mode. While performing the respective instances of imaging, a reference intensity detector (e.g., reference intensity detector 416, FIG. 4) is used to measure (1012) reference intensities of EUV light collected from the photomask.

In some embodiments (e.g., in which the photomask includes (1004) a plurality of regions with respective line-space grating patterns of alternating EUV-absorber lines and EUV-reflective multi-layer coatings), an aperture (e.g., aperture 412, FIG. 4) is positioned to select a zeroth-order diffraction beam (e.g., zeroth-order beam 406, FIG. 4) as the light collected from the photomask.

Based on the results of the respective instances of imaging and the measured reference intensities of EUV light, linearity of the TDI sensor is determined (1014). In some embodiments, pixel-by-pixel linearity of the TDI sensor is determined (1016) based on the results of the respective instances of imaging and the measured reference intensities. A pixel-by-pixel comparison of the signal from the TDI sensor and the signal from the reference intensity detector is performed to determine the pixel-by-pixel linearity. In some embodiments, a TDI integrated intensity linearity (e.g., a scan-averaged intensity linearity) for the TDI sensor is determined (1018) based on the pixel-by-pixel linearity, by integrating the pixel-by-pixel calibration results (e.g., by integrating the calibration results for the full two-dimensional pixel array of the TDI sensor in the direction of the TDI scan).

In some embodiments, the EUV beam is pulsed when illuminating (1012) the plurality of distinctly patterned regions. Because the image is moved in accordance with movement of the photomask during inspection, this pulsing may have the effect of selecting a subset of pixels in the TDI sensor. Linearity of this subset of pixels may be determined in step 1014.

At this point in the method 1000, the TDI sensor has been calibrated and the TDI inspection tool is ready for use. A production photomask (e.g., a reticle that has been fabricated but not yet used to fabricate semiconductor devices) is inspected (1020) using the TDI inspection tool. This inspection is performed to check the production photomask for defects. Results of inspecting the production photomask are corrected (1022) based on the determined linearity of the TDI sensor. For example, an image generated in the inspection step 1020 is corrected based on the determined linearity of the TDI sensor. Steps 1020 and 1022 may be performed repeatedly to inspect multiple production photomasks once the TDI sensor has been calibrated. The calibration process of steps 1002-1014 may be repeated periodically to ensure accurate operation of the TDI inspection tool.

System Block Diagram

Figure 11:
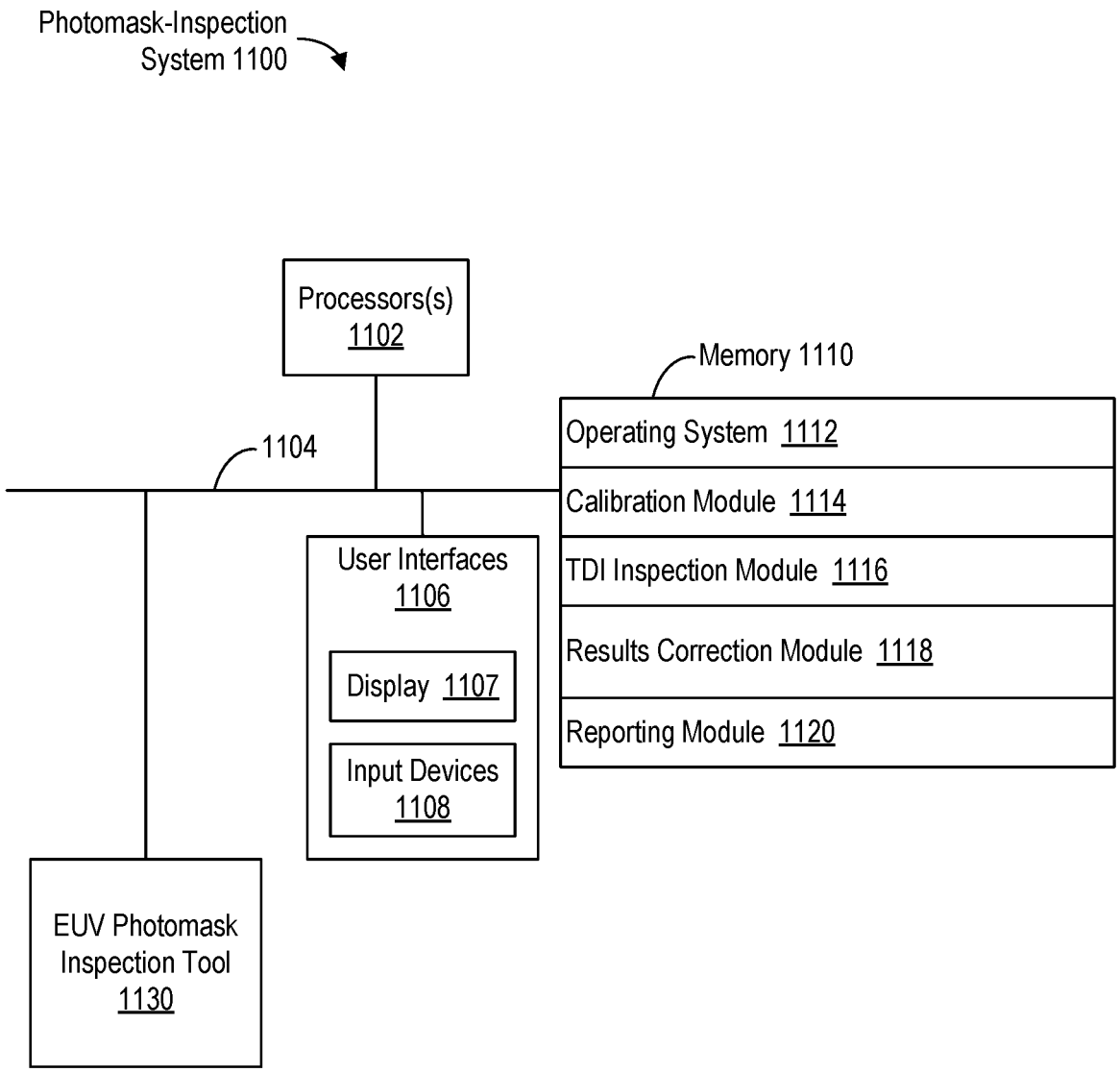
FIG. 11 is a block diagram of a photomask-inspection system in accordance with some embodiments.

FIG. 11 is a block diagram of a photomask-inspection system 1100 (i.e., a reticle-inspection system) in accordance with some embodiments. The photomask-inspection system 1100 includes an EUV photomask inspection tool 1130 and a computer system with one or more processors 1102 (e.g., CPUs), user interfaces 1106, memory 1110, and communication bus(es) 1104 interconnecting these components. The computer system alternatively may be communicatively coupled with the EUV photomask inspection tool 1130 through one or more networks. The computer system may further include one or more network interfaces (wired and/or wireless, not shown) for communicating with the EUV photomask inspection tool 1130 and/or remote computer systems.

In some embodiments, the photomask-inspection system 1100 is configurable to perform the off-axis imaging of FIG. 4. The aperture 412 may be installed in the inspection tool 1130 (e.g., permanently or temporarily for calibration). The reference intensity detector 416 may be installed in the inspection tool 1130 (e.g., temporarily for calibration). A test photomask may be loaded into the inspection tool 1130 to perform calibration. Production photomasks may be loaded into the calibrated inspection tool 1130 for inspection.

The user interfaces 1106 may include a display 1107 and one or more input devices 1108 (e.g., a keyboard, mouse, touch-sensitive surface of the display 1107, etc.). The display 1107 may display results of the method 1000 (FIG. 10).

Memory 1110 includes volatile and/or non-volatile memory. Memory 1110 (e.g., the non-volatile memory within memory 1110) includes a non-transitory computer-readable storage medium. Memory 1110 optionally includes one or more storage devices remotely located from the processors 1102 and/or a non-transitory computer-readable storage medium that is removably inserted into the system 1100. In some embodiments, memory 1110 (e.g., the non-transitory computer-readable storage medium of memory 1110) stores the following modules and data, or a subset or superset thereof: an operating system 1112 that includes procedures for handling various basic system services and for performing hardware-dependent tasks, a calibration module 1114 for calibrating the inspection tool 1130 using a patterned test photomask (e.g., patterned in accordance with FIGS. 2, 3, 5A-5B, 7, and/or 8A-8B) (e.g., test photomask 400, FIG. 4), a TDI inspection module 1116 for inspecting photomasks, a results correction module 1118 for correcting inspection results (e.g., images) based on the TDI-sensor linearity determined through calibration, and a reporting module 1120 for reporting calibration and/or inspection results. The memory 1110 (e.g., the non-transitory computer-readable storage medium of the memory 1110) thus includes instructions for performing all or a portion of the method 1000 (FIG. 10).

Each of the modules stored in the memory 1110 corresponds to a set of instructions for performing one or more functions described herein. Separate modules need not be implemented as separate software programs. The modules and various subsets of the modules may be combined or otherwise re-arranged. In some embodiments, the memory 1110 stores a subset or superset of the modules and/or data structures identified above.

FIG. 11 is intended more as a functional description of various features that may be present in a photomask-inspection system than as a structural schematic. For example, the functionality of the computer system in the photomask-inspection system 1100 may be split between multiple devices. A portion of the modules stored in the memory 1110 may alternatively be stored in one or more other computer systems communicatively coupled with the computer system of the photomask-inspection system 1100 through one or more networks.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A calibration method, comprising:
    loading a photomask into a time-delay-integration (TDI) inspection tool, the photomask comprising a plurality of distinctly patterned regions;
    successively illuminating the plurality of distinctly patterned regions with an extreme ultraviolet (EUV) beam of light;
    while illuminating respective distinctly patterned regions of the plurality of distinctly patterned regions, performing respective instances of imaging of the respective distinctly patterned regions using a TDI sensor in the TDI inspection tool;
    while performing the respective instances of imaging, using a reference intensity detector to measure reference intensities of EUV light collected from the photomask; and
    based on the results of the respective instances of imaging and the reference intensities of EUV light measured by the reference intensity detector, determining linearity of the TDI sensor, wherein the linearity of the TDI sensor indicates how accurately the TDI sensor measures the intensity of EUV light incident on the TDI sensor for different intensity levels of EUV light.

2. The method of claim 1, wherein determining the linearity of the TDI sensor comprises:
    determining pixel-by-pixel linearity of the TDI sensor, based on the results of the respective instances of imaging and the reference intensities of EUV light measured by the reference intensity detector; and
    determining a TDI integrated intensity linearity for the TDI sensor based on the pixel-by-pixel linearity.

3. The method of claim 1, wherein:
    the illuminating comprises pulsing the EUV beam; and
    the determining comprises determining linearity of a subset of pixels in the TDI sensor, the subset being selected by the pulsing.

4. The method of claim 1, wherein the photomask is a calibration photomask distinct from a production photomask, the method further comprising, after determining the linearity of the TDI sensor:
    inspecting the production photomask using the TDI inspection tool; and
    correcting results of the inspecting, based on the determined linearity of the TDI sensor.

5. The method of claim 1, wherein:
    the plurality of distinctly patterned regions comprises a plurality of regions having respective line-space grating patterns of alternating EUV-absorber lines and EUV-reflective multi-layer coatings; and
    the respective line-space grating patterns have distinct respective absorber duty ratios, the absorber duty ratios being ratios of EUV-absorber line width to grating pitch.

6. The method of claim 5, further comprising positioning an aperture to select a zeroth-order diffraction beam as the light collected from the photomask.

7. The method of claim 5, wherein the respective line-space grating patterns have distinct respective EUV-absorber line widths but have identical grating pitches.

8. The method of claim 1, wherein:
    the plurality of distinctly patterned regions comprises a plurality of regions having respective EUV-reflective multi-layer coatings; and
    the respective EUV-reflective multi-layer coatings have distinct respective numbers of layers.

9. The method of claim 1, wherein the plurality of distinctly patterned regions composes a graded EUV-reflective multi-layer coating.

10. The method of claim 9, wherein:
the graded EUV-reflective multi-layer coating comprises a number of alternating layers of Mo and Si;
the alternating layers of Mo and Si have graded thicknesses in a first direction and uniform thicknesses in a second direction perpendicular to the first direction; and
the alternating layers of Mo and Si have a constant thickness ratio.

11. The method of claim 1, wherein:
the plurality of distinctly patterned regions comprises a plurality of regions comprising respective EUV-absorber areas and respective EUV-reflective multi-layer coatings, the respective EUV-absorber areas being situated above the respective EUV-reflective multi-layer coatings; and
the respective EUV-absorber areas have distinct respective thicknesses.

\* \* \* \* \*